United States Patent
Sung et al.

(10) Patent No.: US 11,732,354 B2
(45) Date of Patent: Aug. 22, 2023

(54) METHOD AND APPARATUS FOR FORMING LAYER, METAL OXIDE TRANSISTOR AND FABRICATION METHOD THEREOF

(71) Applicant: IUCF-HYU (INDUSTRY-UNIVERSITY COOPERATION FOUNDATION HANYANG UNIVERSITY), Seoul (KR)

(72) Inventors: Myung Mo Sung, Seoul (KR); Jinwon Jung, Suwon-si (KR); Jin Seon Park, Seoul (KR)

(73) Assignee: IUCF-HYU (INDUSTRY-UNIVERSITY COOPERATION FOUNDATION HANYANG UNIVERSITY), Seoul (KR)

(*) Notice: Subject to any disclaimer, the term of this patent is extended or adjusted under 35 U.S.C. 154(b) by 158 days.

(21) Appl. No.: 17/235,002

(22) Filed: Apr. 20, 2021

(65) Prior Publication Data
US 2021/0238738 A1 Aug. 5, 2021

Related U.S. Application Data

(60) Division of application No. 16/214,878, filed on Dec. 10, 2018, now Pat. No. 11,015,243, which is a (Continued)

(30) Foreign Application Priority Data

Oct. 18, 2017 (KR) .......................... 10-2017-0134979
Oct. 18, 2018 (KR) .......................... 10-2018-0124398
Oct. 18, 2018 (KR) .......................... 10-2018-0124418

(51) Int. Cl.
*H01L 21/02* (2006.01)
*C23C 16/40* (2006.01)
(Continued)

(52) U.S. Cl.
CPC ........ *C23C 16/407* (2013.01); *C23C 16/4408* (2013.01); *C23C 16/45527* (2013.01);
(Continued)

(58) Field of Classification Search
None
See application file for complete search history.

(56) References Cited

U.S. PATENT DOCUMENTS 5,916,365 A 6/1999 Sherman
8,530,272 B2 9/2013 Horio et al.
(Continued)

FOREIGN PATENT DOCUMENTS

JP 2008-172244 A 7/2008
JP 2008537979 A 10/2008
(Continued)

OTHER PUBLICATIONS

Tommi Tynell et al., "Atomic layer deposition of ZnO: a review", Semicond. Sci. Technol., 2014, vol. 29, No. 043001, pp. 1-15.

*Primary Examiner* — Asok K Sarkar
(74) *Attorney, Agent, or Firm* — Sughrue Mion, PLLC

(57) ABSTRACT

A layer forming method according to one embodiment of the present invention contains a source gas dosing/pressurizing step of dosing a source gas into a chamber having a substrate loaded therein in a state in which the outlet of the chamber is closed, thereby increasing the pressure in the chamber and adsorbing the source gas onto the substrate; a first main purging step of purging the chamber, after the source gas dosing/pressurizing step; a reactive gas dosing step of dosing a reactive gas into the chamber, after the first main purging step; and a second main purging step of purging the chamber, after the reactive gas dosing step.

8 Claims, 18 Drawing Sheets

Related U.S. Application Data continuation of application No. PCT/KR2018/012366, filed on Oct. 18, 2018.

(51) Int. Cl.
*H01L 29/786* (2006.01)
*C23C 16/455* (2006.01)
*C23C 16/44* (2006.01)
*H01L 29/66* (2006.01)

(52) U.S. Cl.
CPC .. *C23C 16/45553* (2013.01); *C23C 16/45557* (2013.01); *H01L 21/0262* (2013.01); *H01L 21/02554* (2013.01); *H01L 29/7869* (2013.01); *H01L 21/02488* (2013.01); *H01L 29/66969* (2013.01)

(56) References Cited

U.S. PATENT DOCUMENTS

| | | | |
|---|---|---|---|
| 9,890,458 | B2 | 2/2018 | Yamamoto et al. |
| 2003/0013320 | A1 | 1/2003 | Kim et al. |
| 2006/0185593 | A1 | 8/2006 | Choi |
| 2006/0211246 | A1 | 9/2006 | Ishizaka et al. |
| 2008/0317972 | A1 | 12/2008 | Hendriks et al. |
| 2013/0032797 | A1 | 2/2013 | Hirano et al. |
| 2019/0062917 | A1 | 2/2019 | Sung et al. |
| 2019/0355751 | A1 | 11/2019 | Okazaki et al. |
| 2019/0363193 | A1* | 11/2019 | Dewey .............. H01L 29/78693 |

FOREIGN PATENT DOCUMENTS

| | | | |
|---|---|---|---|
| JP | 2010073750 | A | 4/2010 |
| JP | 2010272807 | A | 12/2010 |
| JP | 2013251411 | A | 12/2013 |
| JP | 2013251470 | A | 12/2013 |
| JP | 2015159247 | A | 9/2015 |
| KR | 1020060093611 | A | 8/2006 |
| KR | 1020070073464 | A | 7/2007 |
| KR | 100811281 | B1 | 3/2008 |
| KR | 1020090017073 | A | 2/2009 |
| KR | 1020090017127 | A | 2/2009 |
| KR | 1020130088487 | A | 8/2013 |
| KR | 1020130139744 | A | 12/2013 |
| WO | 2017/188785 | A1 | 11/2017 |

* cited by examiner

[FIG. 1]
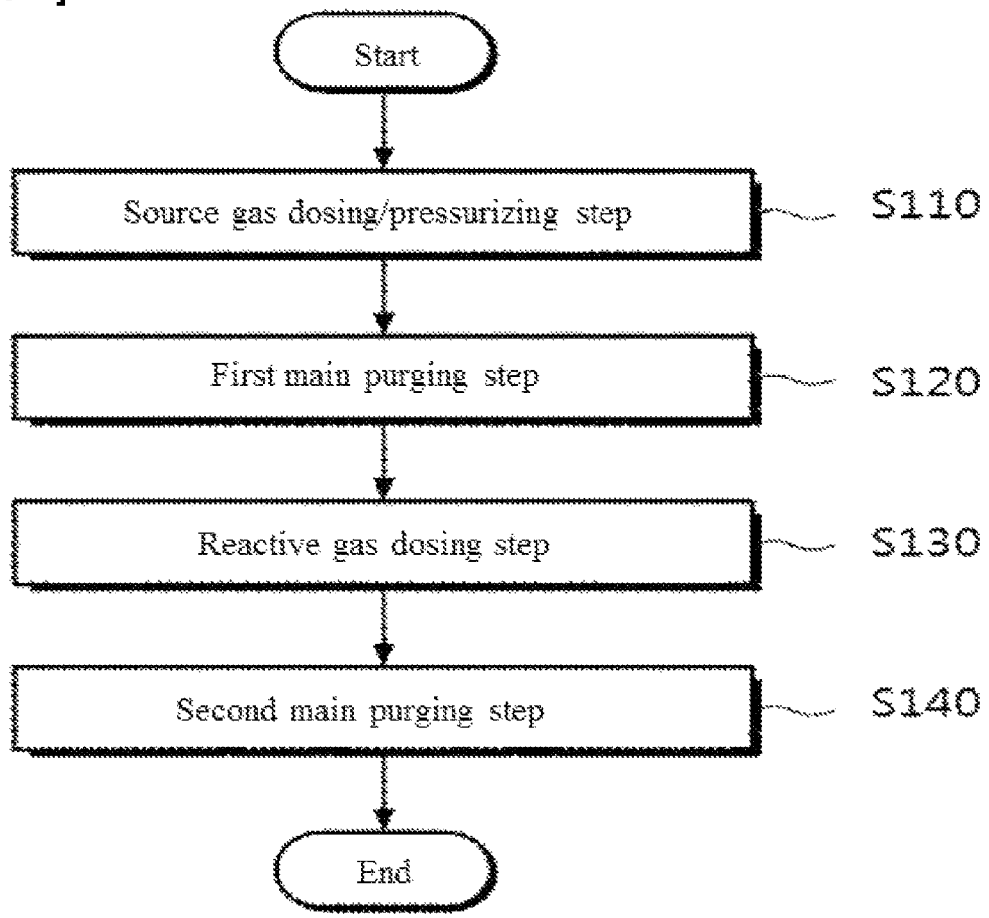

[FIG. 2]
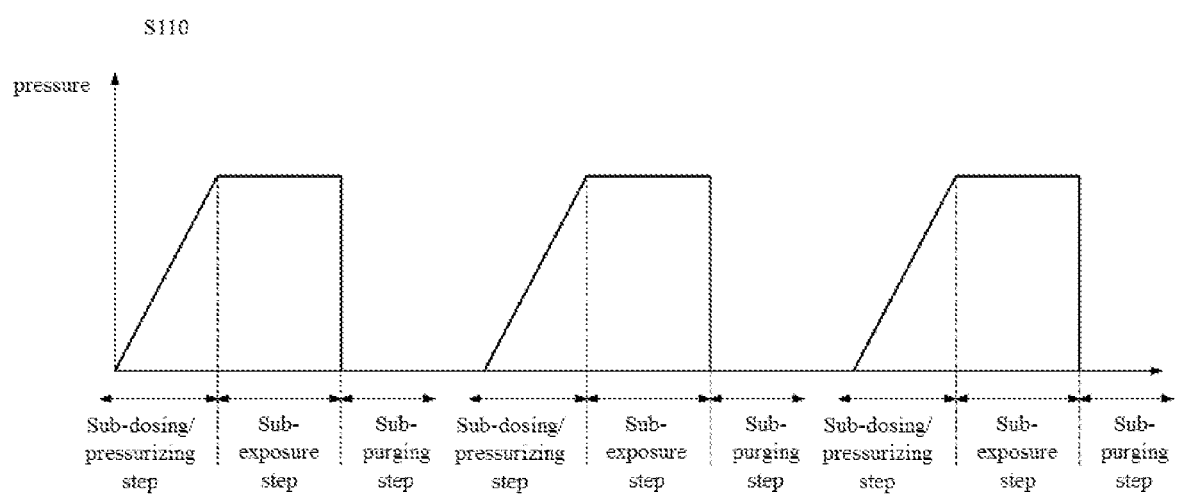

[FIG. 3]
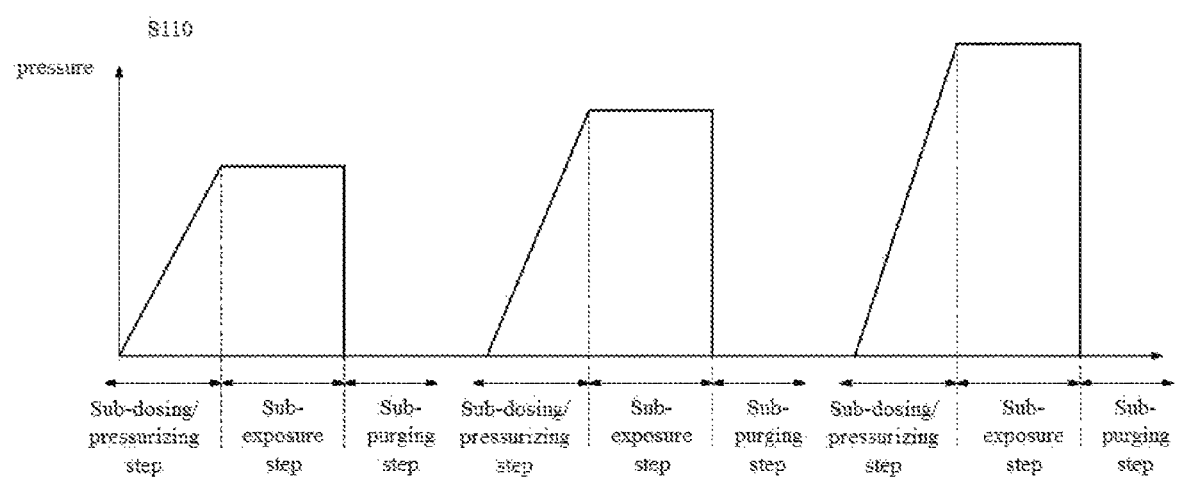

| DEZ | P | DEZ | P | DEZ | P | DEZ | P |
|---|---|---|---|---|---|---|---|
| 3s | 15s | 3s | 15s | 3s | 15s | 3s | 15s |
| 0.1 Torr | | 0.3 Torr | | 0.5 Torr | | 1 Torr | |

| $H_2O$ | P | $H_2O$ | P | $H_2O$ | P | $H_2O$ | P |
|---|---|---|---|---|---|---|---|
| 3s | 25s | 3s | 25s | 3s | 25s | 3s | 25s |
| 0.1 Torr | | 0.3 Torr | | 0.5 Torr | | 1 Torr | |

[FIG. 4A]  Forming process according to the present invention

| DEZ | P | $H_2O$ | P |
|---|---|---|---|
| 2s | 20s | 2s | 40s |
| 30 mTorr | | 30 mTorr | |

[FIG. 4B]  Forming process according to conventional art

[FIG. 5]
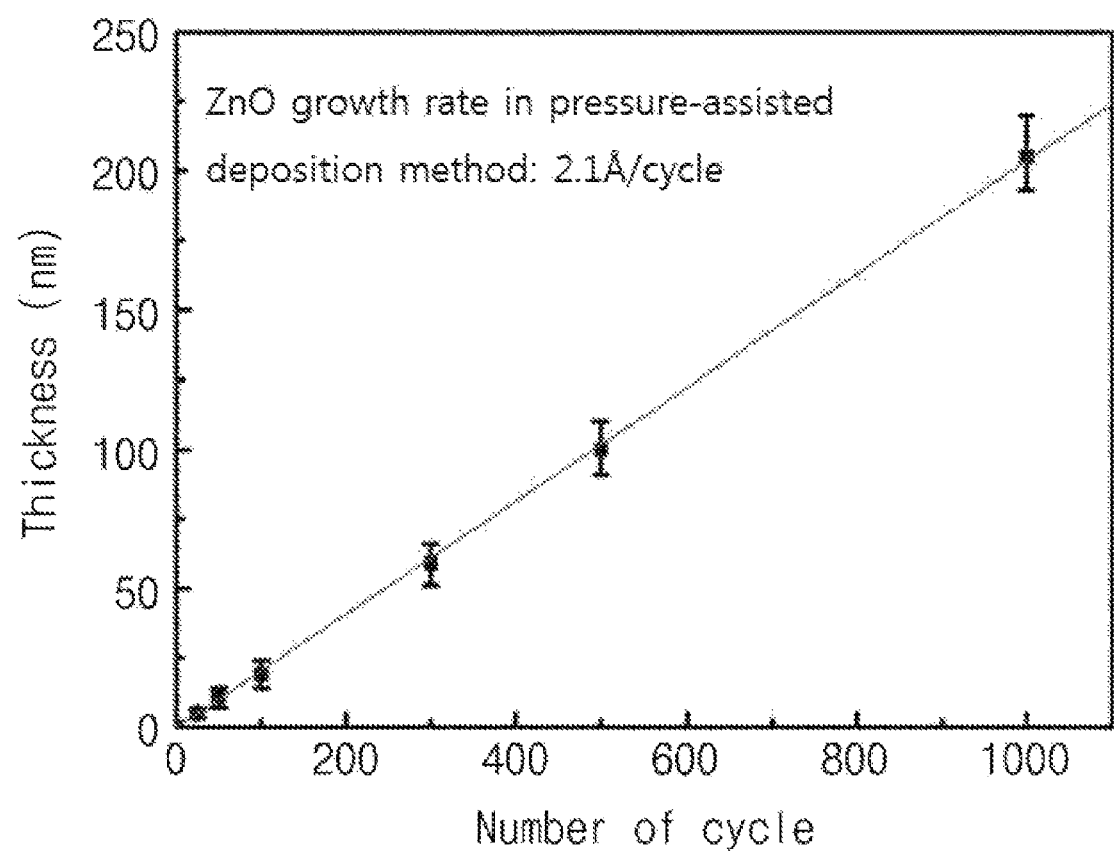

[FIG. 6]
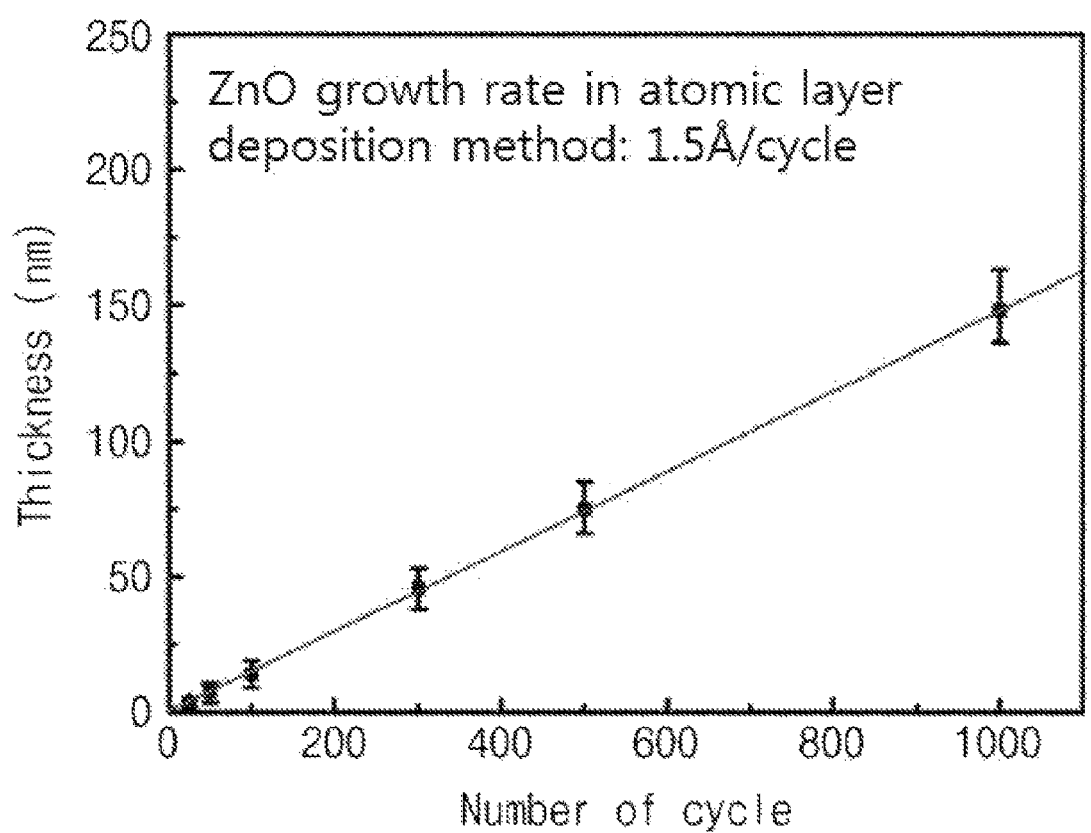

[FIG. 7]
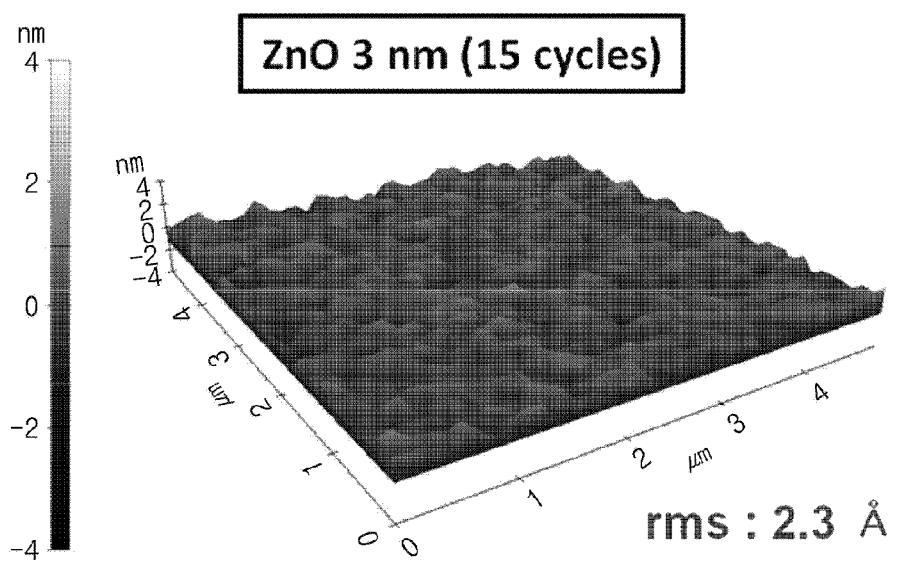

[FIG. 8]
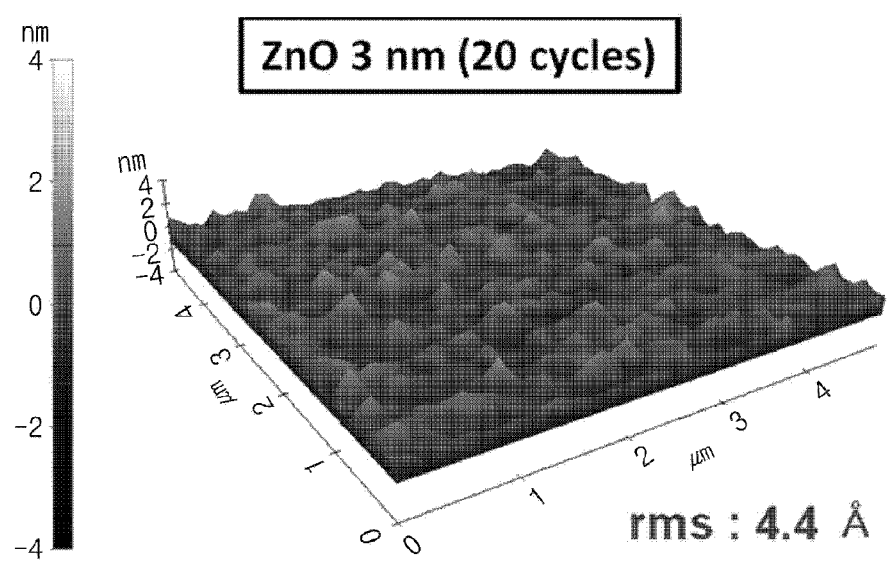

[FIG. 9]
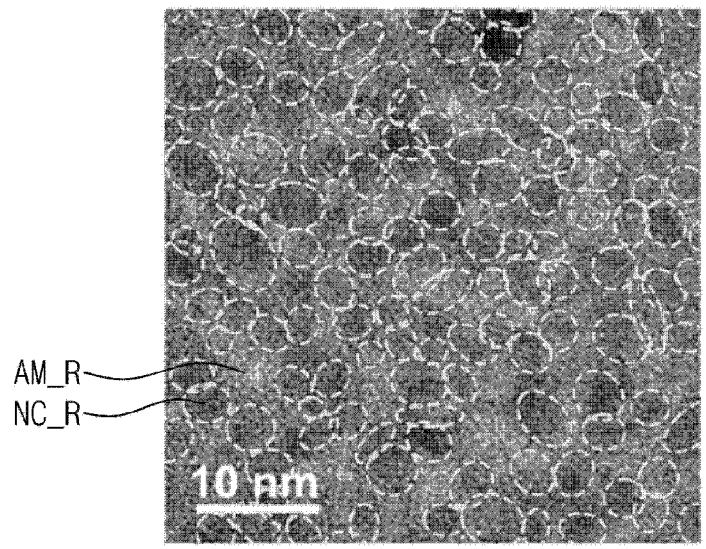

[FIG. 10]
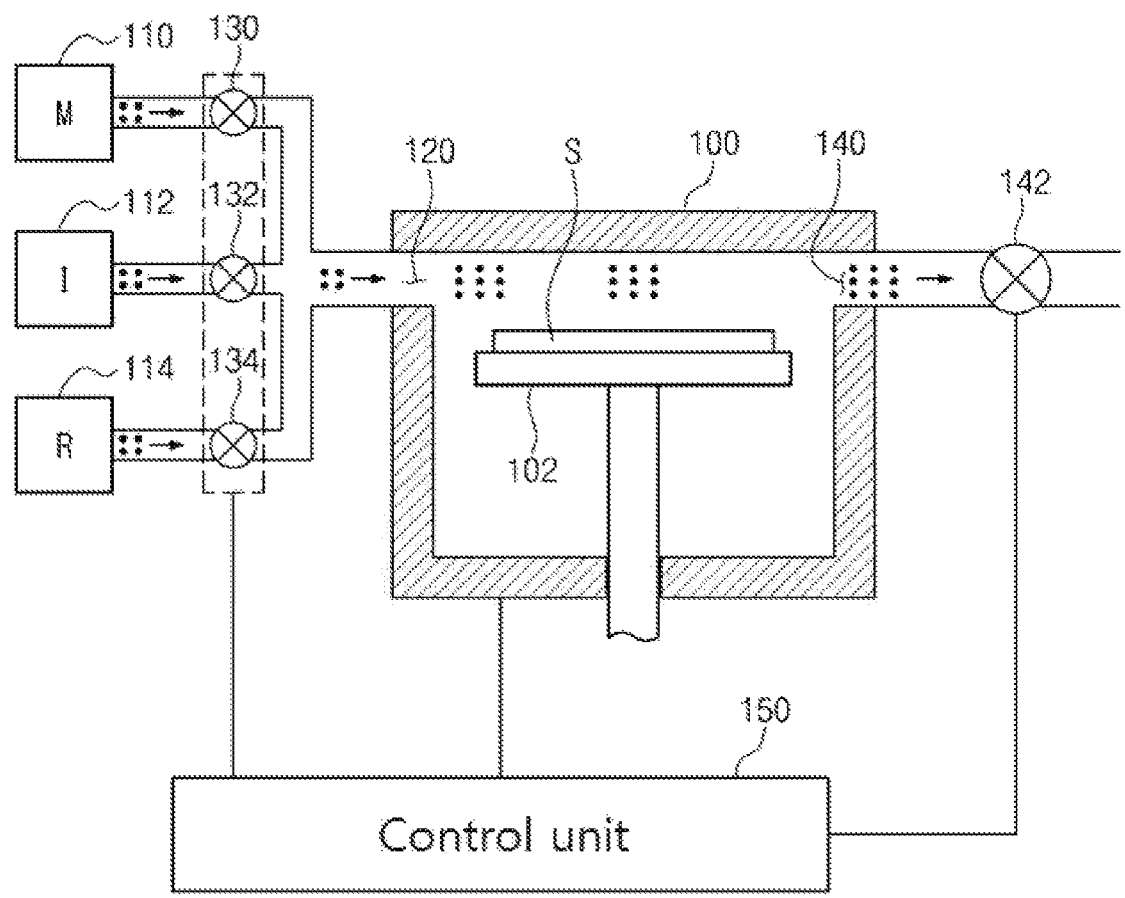

[FIG. 11]
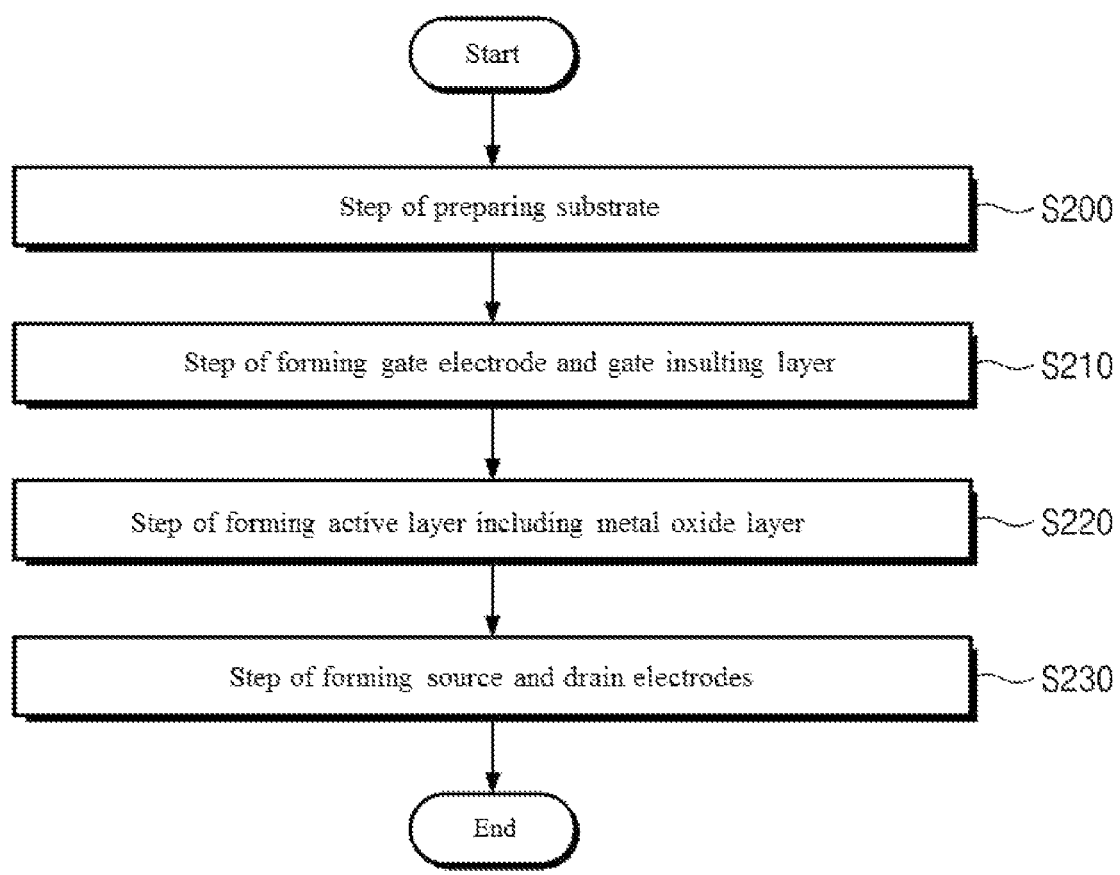

[FIG. 12]
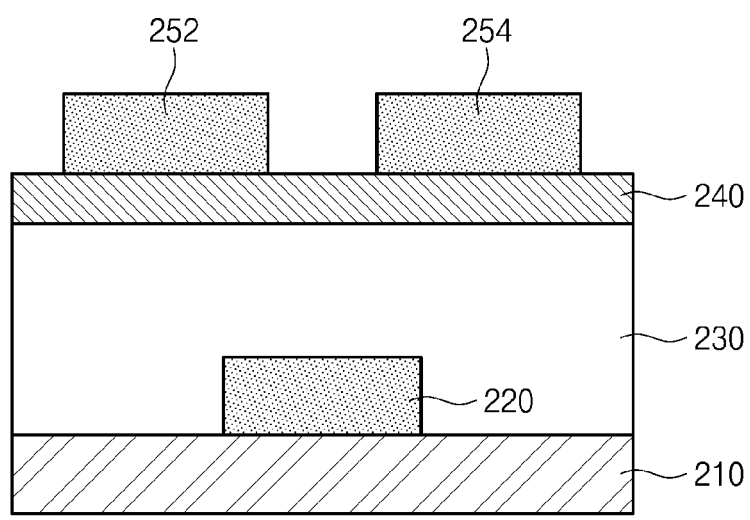

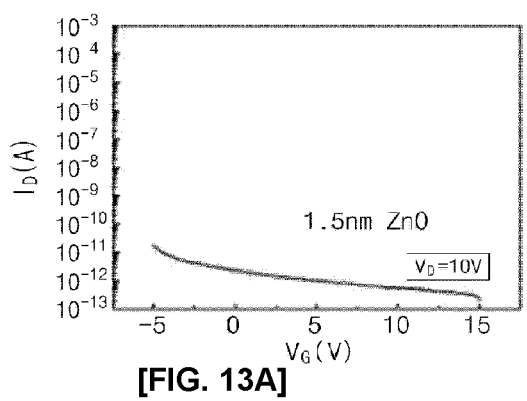
[FIG. 13A]
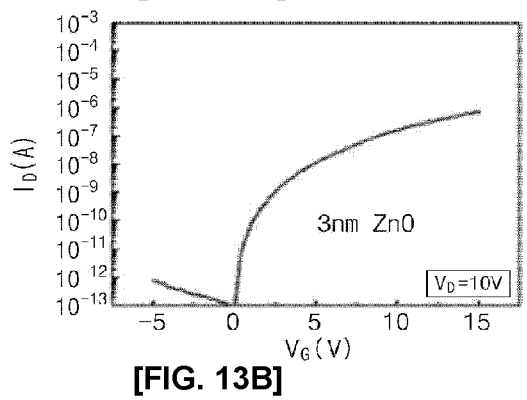
[FIG. 13B]
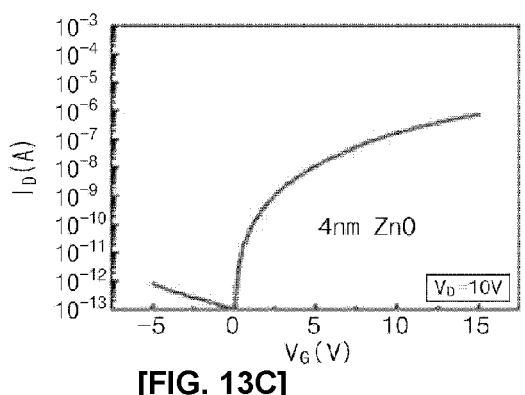
[FIG. 13C]

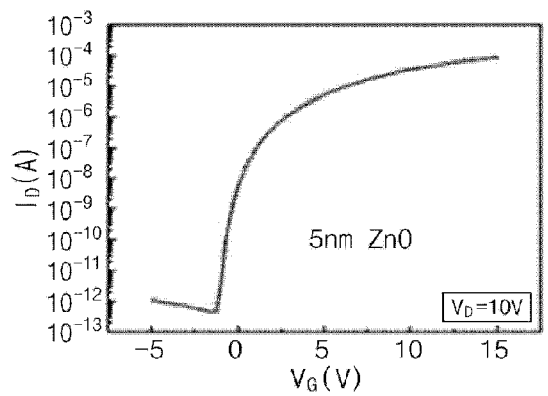
[FIG. 13D]
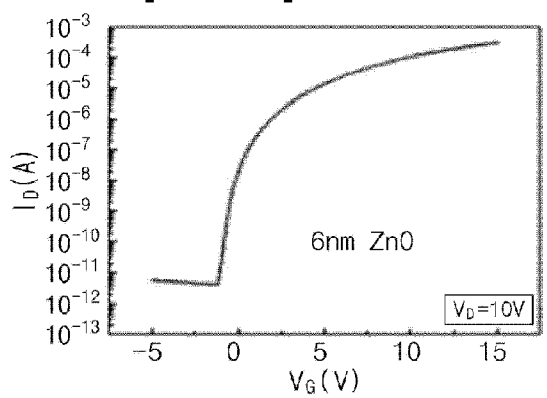
[FIG. 13E]
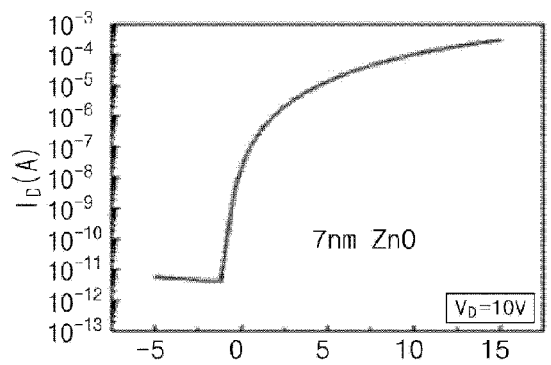
[FIG. 13F]

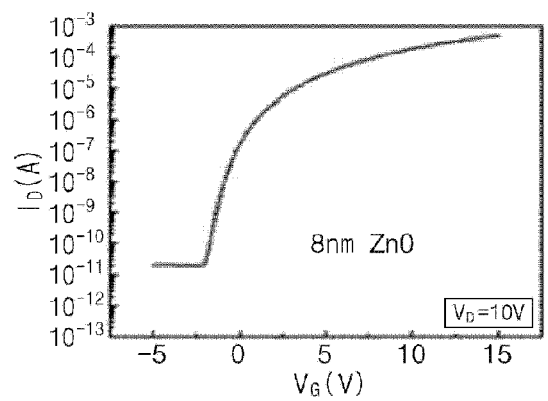
[FIG. 13G]
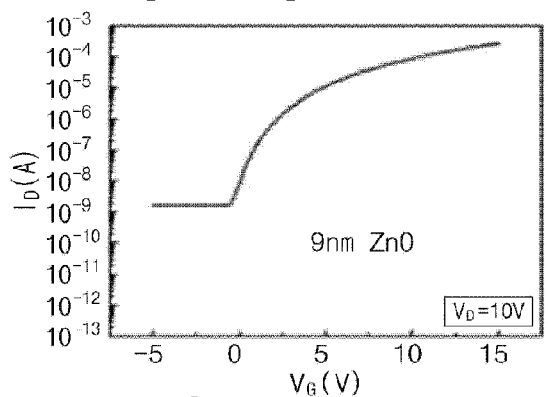
[FIG. 13H]
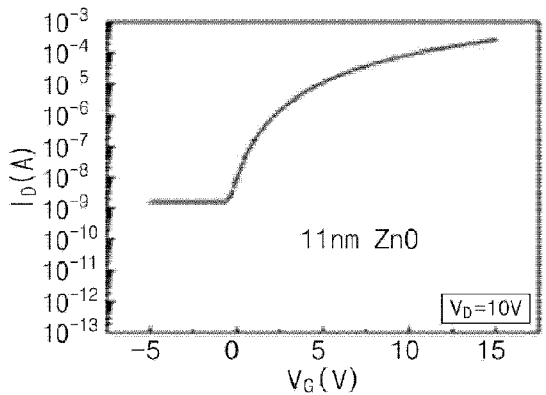
[FIG. 13I]

[FIG. 14]

| Thickness | 1.5nm | 3nm | 4nm | 5nm | 6nm | 7nm | 8nm | 9nm | 11nm |
|---|---|---|---|---|---|---|---|---|---|
| On/Off ratio | - | $7.3*10^6$ | $1.2 \times 10^8$ | $1.9*10^8$ | $7.6*10^7$ | $2.5*10^7$ | $3.6*10^6$ | $1.7*10^5$ | $1.6*10^5$ |
| Mobility ($Cm^6$/Vs) | - | 0.14 | 6.81 | 30.05 | 37.22 | 50.02 | 34.77 | 29.86 | 31.16 |
| Turn-on voltage | - | 0 | -0.25 | -1.5 | -1.25 | -2.25 | -1.5 | -1.25 | -2.95 |
| SS value (mV/decade) | - | 0.25 | 0.3 | 0.35 | 0.35 | 0.55 | 0.6 | 1.3 | 1.25 |

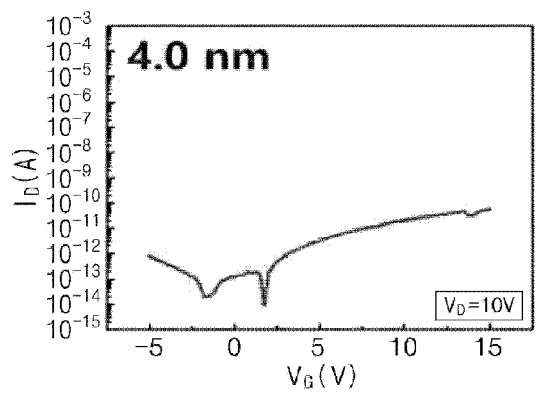
[FIG. 15A]
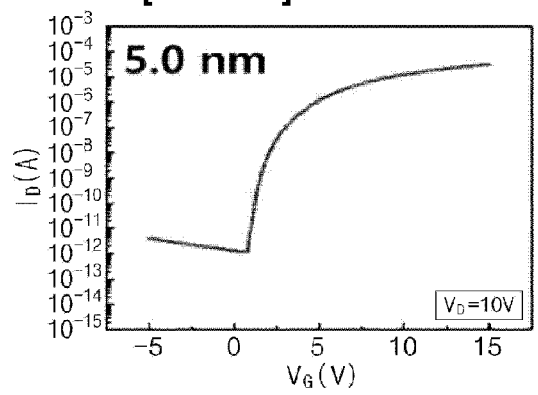
[FIG. 15B]
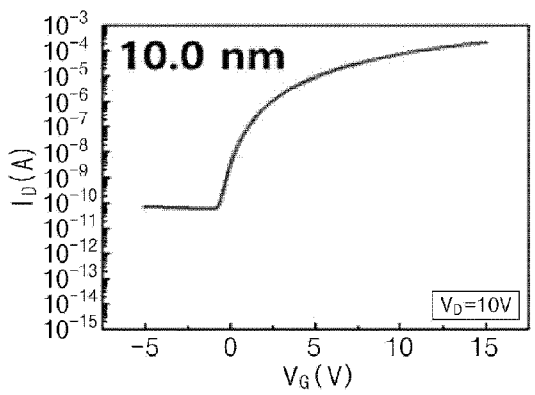
[FIG. 15C]

[FIG. 16]

| Thickness(nm) | 4.0 | 5.0 | 10.0 |
|---|---|---|---|
| $I_{ON}/I_{OFF}$ ratio | – | $3.6 \times 10^7$ | $3.8 \times 10^6$ |
| Mobility ($Cm^2/Vs$) | – | 2.1 | 17.3 |
| Turn-on voltage(V) | – | 0.5 | –1 |
| SS value (mV/decade) | – | 0.7 | 0.8 |

METHOD AND APPARATUS FOR FORMING LAYER, METAL OXIDE TRANSISTOR AND FABRICATION METHOD THEREOF

CROSS REFERENCE TO RELATED APPLICATIONS

This application is a Divisional Application of U.S. application Ser. No. 16/214,878 filed on Dec. 10, 2018, which is a Continuation Application of International Application No. PCT/KR2018/012366 filed on Oct. 18, 2018, which claims priority to Korean Patent Application Nos. 10-2017-0134979 filed on Oct. 18, 2017, 10-2018-0124398 filed on Oct. 18, 2018, and 10-2018-0124418 filed on Oct. 18, 2018. Each of the above applications is hereby expressly incorporated by reference in its entirety.

TECHNICAL FIELD

The present invention relates to a method and an apparatus for forming a layer, a metal oxide transistor and a fabrication method thereof.

BACKGROUND ART

As the development of processes for fabricating scale-down elements has become more intense, various studies on the deposition of better layers, for example, metal oxide layers, have been conducted.

Metal oxides are currently widely used in various electronic semiconductor devices. They are typically used as active layers or dielectric layers for devices, and various studies on processes for depositing them have also been conducted.

In conventional processes of forming metal oxide layers by atomic layer deposition, there are limitations in forming an inorganic thin layer having high step coverage with a very thin thickness of a few nm. In addition, when liquid phase processes are used, there are difficulties in obtaining reproducible samples, difficulties in achieving large area fabrication, difficulties in achieving precise thickness control, difficulties in selecting a proper solvent that do not interacts with a substrate while dissolving a solute, and limitations in commercialization.

DISCLOSURE

Technical Problem

It is an object of the present invention to provide a method and an apparatus for forming a layer, which are capable of depositing a layer in a simple and easy manner.

Another object of the present invention is to provide a method and an apparatus for forming a good-quality layer.

Still another object of the present invention is to provide a method and an apparatus for forming a layer, which can deposit a layer through a low-temperature process.

Still another object of the present invention is to provide a method and an apparatus for forming a layer, which can easily control the layer thickness.

Still another object of the present invention is to provide a method and an apparatus for forming a layer, which can deposit a layer at high rate.

Still another object of the present invention is to provide a method and an apparatus for forming a layer having an excellent surface morphology.

Still another object of the present invention is to provide a metal oxide transistor having an active layer including a metal oxide layer, and a method for fabricating the same.

Still another object of the present invention is to provide a metal oxide transistor having high mobility, and a method for fabricating the same.

Still another object of the present invention is to provide a metal oxide transistor having high on/off ratio, and a method for fabricating the same.

However, objects which are to be achieved by the present invention are not limited to the above-mentioned objects, and other objects of the present invention will be clearly understood by those skilled in the art from the following description.

Technical Solution

A layer forming method according to one embodiment of the present invention may comprise: a source gas dosing/pressurizing step of dosing a source gas into a chamber having a substrate loaded therein in a state in which the outlet of the chamber is closed, thereby increasing the pressure in the chamber and adsorbing the source gas onto the substrate; a first main purging step of purging the chamber, after the source gas dosing/pressurizing step; a reactive gas dosing step of dosing a reactive gas into the chamber, after the first main purging step; and a second main purging step of purging the chamber, after the reactive gas dosing step.

According to one embodiment, the source gas dosing/pressurizing step may further comprise the steps of: increasing the pressure in the chamber to a predetermined pressure by dosing the source gas; and maintaining the predetermined pressure by closing the inlet of the chamber.

According to one embodiment, the source gas dosing/pressurizing step may comprise at least two sub-dosing/pressurizing steps and a sub-purging step between the at least two sub-dosing/pressurizing steps.

According to one embodiment, the source gas dosing/pressurizing step may further comprise, between the sub-dosing/pressurizing step and the sub-purging step, a step of maintaining the chamber pressure that has been increased by the sub-dosing/pressurizing step.

According to one embodiment, the reactive gas dosing step may further comprise the steps of: increasing the pressure in the chamber to a predetermined pressure by dosing the reactive gas;
and maintaining the predetermined pressure by closing the inlet of the chamber.

According to one embodiment, the reactive gas dosing step may comprise at least two sub-dosing/pressurizing steps and a sub-purging step between the at least two sub-dosing/pressurizing steps.

According to one embodiment, the reactive gas dosing step may further comprise, between the sub-dosing/pressurizing step and the sub-purging step, a step of maintaining the chamber pressure that has been increased by the sub-dosing/pressurizing step.

According to one embodiment, the source gas may comprise a metal precursor for forming a metal oxide layer by deposition. According to one embodiment, the metal oxide layer, formed by the source gas dosing/pressurizing step, the first main purging step, the reactive gas dosing step and the second purging step, may have a surface roughness (RMS) lower than 4.4 Å.

According to one embodiment, the metal oxide layer, formed by the source gas dosing/pressurizing step, the first main purging step, the reactive gas dosing step and the second purging step, may comprise a plurality of crystalline regions, and an amorphous region surrounding the crystalline regions.

According to one embodiment, each of the crystalline regions may have a nanometer size.

A layer forming apparatus according to one embodiment of the present invention may comprise: an inlet configured to supply a source gas, an inert gas and a reactive gas; a chamber configured to communicate with the inlet and accommodate a substrate; an outlet configured to discharge the gases supplied into the chamber; and a control unit configured to close the outlet when the source gas is supplied into the chamber, thereby increasing the pressure in the chamber and adsorbing the source gas onto the substrate.

According to one embodiment, the control unit may be configured to close the inlet of the chamber when the pressure in the chamber reaches a predetermine pressure, and to maintain the closed state for a predetermined time.

According to one embodiment, the control unit may be configured to provide a pressure for at least two sub-dosing/pressurizing steps and a pressure for a sub-purging step between the at least two sub-dosing/pressurizing steps.

According to one embodiment, the source gas may comprise a metal oxide precursor for metal oxide deposition.

A metal oxide transistor according to one embodiment of the present invention may comprise: a gate electrode; a gate insulating layer formed on one side of the gate electrode; an active layer formed on one side of the gate insulating layer and including a metal oxide layer; and source and drain electrodes provided on one side of the active layer.

According to one embodiment, the thickness of the metal oxide layer may be greater than 1.5 nm.

According to one embodiment, the thickness of the metal oxide layer may be greater than 1.5 nm and not greater than 7 nm.

According to one embodiment, the thickness of the metal oxide layer may be greater than 1.5 nm and smaller than 5.0 nm.

According to one embodiment, the surface roughness (RMS) of the metal oxide layer may be lower than 4.4 Å.

A method of fabricating a metal oxide transistor according to one embodiment of the present invention may comprise the steps of: preparing a substrate; and forming an active layer including a metal oxide layer on one side of the substrate, wherein the step of forming the active layer may comprise: a source gas dosing/pressurizing step of dosing a source gas for metal oxide deposition into a chamber having the substrate loaded therein in a state in which the outlet of the chamber is closed, thereby increasing the pressure in the chamber and adsorbing the source gas onto the substrate in the closed chamber; a first main purging step of purging the chamber, after the source gas dosing/pressurizing step; a reactive gas dosing step of dosing a reactive gas into the chamber, thereby depositing a metal oxide layer onto the substrate, after the first main purging step; and a second main purging step of purging the chamber, after the reactive gas dosing step.

According to one embodiment, the source gas dosing/pressurizing step, the first main purging step, the reactive gas dosing step and the second main purging step may constitute a unit process, and the electrical properties of the active layer is variable depending on the number of repetitions of the unit process.

According to one embodiment, the number of repetitions of the unit process may be greater than 7 and not greater than 35 when the metal oxide layer comprises zinc oxide.

According to one embodiment, the source gas dosing/pressurizing step may comprise at least two sub-dosing/pressurizing steps and a sub-purging step between the at least two sub-dosing/pressurizing steps.

According to one embodiment, the magnitude of a pressure for each of the at least two sub-dosing/pressurizing steps may increase depending on the number of repetition of the sub-dosing/pressurizing step.

According to one embodiment, the source gas dosing/pressurizing step may comprise at least two sub-dosing/pressurizing steps and a sub-purging step between the at least two sub-dosing/pressurizing steps; the reactive gas dosing step may further comprise at least two sub-dosing/pressurizing steps and a sub-purging step between the at least two sub-dosing/pressurizing steps; and the time of the sub-purging step of the source gas dosing/pressurizing step may be shorter than that of the sub-purging step of the reactive gas dosing step.

According to one embodiment, the source gas may comprise diethyl zinc (DEZ), and the reactive gas may comprise $H_2O$.

According to one embodiment, the source gas dosing/pressurizing step, the first main purging step, the reactive gas dosing step and the second main purging step may constitute a unit process, and the unit process may be repeated in a predetermined number.

According to one embodiment, the predetermined number may be greater than 7.

According to one embodiment, the source gas dosing/pressurizing step may further comprise, after increasing the pressure in the chamber by dosing the source gas, an exposure step of maintaining the increased pressure for a predetermined time.

Advantageous Effects

A method and apparatus of forming a layer according to one embodiment of the present invention may provide a good-quality layer while depositing the layer in a simple and easy manner.

A method and apparatus of forming a layer according to one embodiment of the present invention can deposit a layer at low temperature.

A method and apparatus of forming a layer according to one embodiment of the present invention can easily control the layer thickness.

A method and apparatus of forming a layer according to one embodiment of the present invention can provide a good-quality layer at high deposition rate.

A method and apparatus of forming a layer according to one embodiment of the present invention may provide a layer having excellent surface morphology.

A metal oxide transistor and a fabrication method thereof according to an embodiment of the present invention can exhibit excellent FET characteristics.

A metal oxide transistor and a fabrication method thereof according to an embodiment of the present invention can exhibit FET characteristics even when a metal oxide layer therein has a very thin thickness.

The technical effects of the present invention are not limited to the above-mentioned effects, and other effects of the present invention will be clearly understood by those skilled in the art from the following description.

DESCRIPTION OF DRAWINGS

FIG. 1 illustrates a method of forming a layer according to one embodiment of the present invention.

FIGS. 2 and 3 illustrate step S110 according to one embodiment of the present invention.

FIGS. 4A and 4B show process conditions according to one embodiment of the present invention.

FIGS. 5 and 6 show the result of measuring layer growth rate in each of a conventional art and one embodiment of the present invention.

FIGS. 7 and 8 show the results of measuring the surface roughness of each of a layer formed according to a conventional art and a layer formed according to one embodiment of the present invention FIG. 9 is an image showing the crystal characteristic of a layer formed according to one embodiment of the present invention.

FIG. 10 illustrates a layer forming apparatus according to one embodiment of the present invention.

FIG. 11 is a flow chart illustrating a method of fabricating a metal oxide transistor according to one embodiment of the present invention.

FIG. 12 illustrates a metal oxide transistor according to one embodiment of the present invention.

FIGS. 13A-13I show the results of measuring the FET characteristics of metal oxide transistors fabricated according to one embodiment of the present invention FIG. 14 quantitatively shows the FET characteristic measurement results shown in FIGS. 13A-13I.

FIGS. 15A-15C show the results of measuring the FET characteristics of metal oxide transistors fabricated according to a conventional art.

FIG. 16 quantitatively shows the FET characteristic measurement results shown in FIGS. 15A-15B.

BEST MODE

Hereinafter, exemplary embodiments of the present invention will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

In the specification, when any element is referred to as being "on" other element, it means that the element may be formed directly on the other element, or that a third element may be interposed therebetween. In the drawings, the thicknesses of layers and regions may have been exaggerated in order to clearly illustrate features of the embodiments.

In addition, although the terms 'first', 'second', "third" etc. may be used to describe various elements in various embodiments of the present invention, these elements should not be limited by these terms. These terms are only used to distinguish any element from other element. Thus, a first element mentioned in any one embodiment may be termed a second element in other embodiment. Each embodiment described and exemplified herein also includes a complementary embodiment thereof. As used herein, the term "and/or" is meant to include at least one of components listed before and after the term "and/or".

In the specification, singular expressions include plural expressions unless specified otherwise in the context thereof. In addition, the terms "comprise", "have", etc., are intended to denote the existence of mentioned characteristics, numbers, steps, elements, components, or combinations thereof, but do not exclude the probability of existence or addition of one or more other characteristics, numbers, steps, elements, components, or combinations thereof. As used herein, the term "connecting" includes connecting a plurality of elements both directly and indirectly.

Furthermore, in the following description, detailed description of related known functions and configurations will be omitted when it may unnecessarily obscure the subject matter of the present invention.

FIG. 1 illustrates a method of forming a layer according to one embodiment of the present invention, and FIGS. 2 and 3 illustrate step S110 according to one embodiment of the present invention.

Referring to FIG. 1, a method of forming a layer by pressure-assisted deposition according to one embodiment of the present invention may comprise at least one of a source gas dosing/pressurizing step (S110), a first main purging step (S120), a reactive gas dosing step (S130), and a second main purging step (S140). Hereinafter, each of the method will be described.

Step S110

For the source gas dosing/pressurizing step (S110), a source gas may be prepared. The kind of source gas to be prepared may vary depending on the type of layer to be deposited. For example, when a layer to be deposited is a metal oxide layer, a metal precursor source gas corresponding thereto may be prepared. For example, when a layer to be deposited is a zinc oxide (ZnO) layer, the source gas may comprise DEZ (diethyl zinc).

The source gas may be dosed into a chamber in a state in which the chamber outlet is to closed. Accordingly, as the source gas is dosed into the chamber, the pressure in the chamber can increase. In other words, the pressure in the chamber is increased by dosing of the source gas, and hence the source gas may be adsorbed onto a substrate in a pressurized atmosphere.

The increased pressure in step S110 may be higher than 0.03 Torr, preferably, 0.1 Torr or higher, and more preferably 0.3 Torr or higher. In addition, step S110 may be performed at a temperature of 20° C. to 250° C.

Step S120

In the first main purging step (S120), inert gas may be used. The inert gas may be, for example, argon (Ar) or nitrogen ($N_2$) gas. Through the purging step, an excess of the source gas that has not been absorbed onto the substrate surface may be removed.

Step S130

In the reactive gas dosing step (S130), a reactive gas may react with the source gas to form the layer to be deposited. For example, when the source gas comprises DEZ, the reactive gas may comprise $H_2O$.

Step S140

After the reactive gas dosing step, the second main purging step (S140) may further be performed. This can remove an excess of the gas that has not been adsorbed onto the substrate surface.

Step S110 to step S140 according to one embodiment of the present invention have been described above. Hereinafter, dosing/pressurizing of step S110 will be described in detail.

Dosing/Pressurizing of Step S110

The source gas dosing/pressurizing step (step S110) may be performed in a pressurized atmosphere. In other words, the source gas dosing/pressurizing step may be performed in a high-pressure atmosphere, and may be abbreviated as "pressurizing step".

Although the source gas dosing/pressurizing step (step S110) will be described in detail for the sake of brevity, it should be understood that dosing/pressurizing may also be performed in the reactive gas dosing step (step S130).

According to one embodiment, the dosing/pressurizing step may be performed in a state in which a chamber having a substrate loaded therein is closed. For example, the discharge valve of a chamber is closed, and in this state, a metal precursor source gas may be dosed into the chamber (sub-dosing/pressurizing step), thereby inducing high pressure in the chamber, and the induced high pressure may be maintained (sub-exposure step). When the high pressure is maintained for a predetermined time, the metal precursor source gas may be adsorbed onto the substrate surface in a high-pressure atmosphere.

According to one embodiment, the dosing/pressurizing step may comprise at least one of a sub-dosing/pressurizing step, a sub-exposure step and a sub-purging step. The sub-dosing/pressurizing step may be defined as a step of dosing the source gas into the chamber in a state in which the outlet of the chamber is closed, thereby causing the pressure in the chamber to reach a predetermined pressure. The sub-exposure step is a step of maintaining the predetermined pressure provided by the sub-dosing/pressurizing step. To this end, the inlet and outlet of the chamber may all be closed. Namely, the chamber may be closed. The sub-purging step may be performed after the sub-exposure step to remove an excess of the source gas dosed.

As shown in FIG. 2, the pressure in the sub-exposure step may be maintained at a constant level, even when the number of the sub-exposure steps increases. Unlike this, as shown in FIG. 3, the pressure in the sub-exposure step may increase as the number of the sub-exposure steps increases.

According to one embodiment, step S110 may be performed at a temperature of 80° C. to 250° C.

In addition, sub-steps of step S110 may be performed at the same temperature. In particular, these sub-steps may be performed at low temperature. As used herein, the term "low temperature" refers to a temperature of 250° C. or below, preferably 80° C. to 250° C.

The layer forming method according to one embodiment of the present invention has been described above with reference to FIGS. 1 to 3. Hereinafter, the performance characteristics of a layer formed according to one embodiment of the present invention will be described.

FIGS. 4A and 4B show process conditions according to one embodiment of the present invention; FIGS. 5 and 6 show the results of measuring layer growth rate in each of a conventional art and one embodiment of the present invention; FIGS. 7 and 8 show the results of measuring the surface roughness of each of a layer formed according to a conventional art and a film formed according to one embodiment of the present invention; and FIG. 9 is an image showing the crystal characteristics of a layer formed according to one embodiment of the present invention.

As shown in FIGS. 4A and 4B, a zinc oxide layer which is a metal oxide layer was formed according to one embodiment of the present invention. The layer forming method is as described above with respect to FIG. 1.

Specifically, referring to FIG. 4A, in step S110, DEZ was dosed by performing sub-dosing/pressurizing dosing five times. Specifically, in the first sub-dosing/pressurizing step, DEX was dosed into a chamber containing a substrate in a state in which the outlet of the chamber was closed, thereby increasing the pressure in the chamber to 1.0 Torr. Next, the inlet of the chamber was also closed, and in this state, DEZ was adsorbed onto the substrate by substrate exposure to DEZ at a pressure of 1.0 Torr for 3 seconds (sub-exposure step). Then, sub-purging was performed for 30 seconds. Next, in the second sub-dosing/pressurizing step, DEZ was dosed into the chamber in a state in which the outlet of the chamber was closed, thereby increasing the pressure in the chamber to 1.0 Torr. Next, the inlet of the chamber was also closed, and in this state, DEZ was adsorbed onto the substrate by substrate exposure to DFZ at a pressure of 1.0 Torr for 3 seconds. In this manner, sub-dosing and sub-exposure were repeated five times.

Next, according to step S120, a first main purging step was performed for 15 seconds.

In step S130, $H_2O$ was dosed by performing sub-dosing/pressurizing and sub-exposure five times. In this step, process parameters, such as pressure and time, were the same as those used in DEZ dosing.

According to one embodiment, each of step S110 and S130 may comprise at least two sub-dosing/pressurizing steps and a sub-purging step between the at least two sub-dosing/pressurizing steps. In this case, the time of the sub-purging step in step S110 may be shorter than the time of the sub-purging step in step S130. This is because the reactive gas $H_2O$ is more likely to aggregate than the source gas DEZ.

A unit cycle composed of the above-described steps was repeatedly performed, thereby controlling the thickness of the zinc oxide, a metal oxide.

In order to confirm the superiority of the zinc oxide layer formed according to one embodiment of the present invention, a zinc oxide layer according to a conventional art was formed.

The "zinc oxide layer according to a conventional art" refers to a metal oxide layer formed according to a conventional atomic deposition process.

Specifically, referring to FIG. 4B, in order to form a metal oxide layer according to a conventional art, a DEZ source gas was supplied to a chamber at a pressure of 30 mTorr for 2 seconds, and the chamber was purged for 20 seconds, after which a $H_2O$ reactive gas was supplied to the chamber at a pressure of 30 mTorr for 2 seconds, followed by purging for 40 seconds. A unit cycle composed of these steps was repeatedly performed.

Referring to FIG. 5, it was confirmed that the method of forming a metal oxide layer by pressure-assisted deposition according to one embodiment of the present invention as shown in FIG. 4A showed a ZnO growth rate of 2.1 Å per cycle.

Unlike this, referring to FIG. 6, it was confirmed that the method of forming a metal oxide layer according to the conventional art as shown in FIG. 4B showed a ZnO growth rate of only 1.5 Å per cycle. This suggests that the layer forming method according to one embodiment of the present invention exhibits a higher layer growth rate than that of the conventional art.

FIG. 7 shows the result of measuring the surface roughness of the metal oxide layer formed according to one embodiment of the present invention, and FIG. 8 shows the result of measuring the surface roughness of the metal oxide layer formed according to the conventional art.

To measure the surface roughness, the unit cycle descried above with reference to FIGS. 4A and 4B was performed 15 times.

Referring to FIG. 7, it was confirmed that the surface roughness (RMS) of the metal oxide layer formed according to one embodiment of the present invention was 2.3 Å, indicating that it has very good morphology. Unlike this, referring to FIG. 8, the surface roughness (RMS) of the metal oxide layer formed according to the conventional art was 4.4 Å.

This suggests that the layer forming method according to one embodiment exhibits better surface morphology than the conventional art.

FIG. 9 is an image showing the crystal characteristics of the layer formed according to one embodiment of the present invention.

To confirm the crystal characteristics of the layer, zinc oxide was first deposited to a thickness of 2.5 nm according to one embodiment of the present invention as described above with reference to FIG. 4A. A TEM image of the zinc oxide layer formed was analyzed, and as a result, it was confirmed that crystalline regions (NC_R) and an amorphous region (AM_R) were present together in the zinc oxide layer. As shown in FIG. 9, the crystalline regions (NC_R) were randomly distributed in a two-dimensional plane, and the amorphous region (AM_R) surrounded the crystalline regions (NC_R). Namely, the crystalline regions (NC_R) were composed of a plurality of island shapes. In addition, the crystalline regions (NC_R) were shown to have a size of about 3 nm. Accordingly, it is expected that the crystalline regions (NC_R) will have a quantum confinement effect.

The layer forming method according to one embodiment of the present invention has been described above. Hereinafter, a layer forming apparatus according to one embodiment of the present invention will be described with reference to FIG. 10.

FIG. 10 illustrates an apparatus of forming a layer by pressure-assisted deposition according to one embodiment of the present invention.

Referring to FIG. 10, an apparatus of forming a layer by pressure-assisted deposition according to one embodiment of the present invention may comprise a chamber 100. The accommodating space of the chamber 100 may be provided with a stage 102 on which a substrate is mounted.

The chamber 100 may have an inlet 120 configured to sequentially receive source gas, inert gas, reactive gas and inert gas, and an outlet configured to discharge the received gas. In addition, the outlet 140 may be provided with a discharge valve 142 configured to control discharge rate.

In addition, the layer forming apparatus according to one embodiment of the present invention may further comprise a source gas storage unit 110 configured to store source gas, an inert gas storage unit 112 configured to store inert gas, and a reactive gas storage unit 114 configured to store reactive gas.

Here, the source gas storage unit 110 may store a source gas corresponding to the type of layer to be deposited. For example, when zinc oxide is to be deposited, the source gas storage unit 110 may store DEZ.

The inert gas storage unit 112 may store argon or nitrogen gas, and the reactive gas storage unit 110 may store a gas corresponding to the source gas.

The metal precursor gas stored in the source gas storage unit 110 may be supplied to the inlet 120 of the chamber 100 through a source gas control valve 130. The inert gas stored in the inert gas storage unit 112 may be supplied to the inlet 120 of the chamber 100 through an inert gas control valve 132. In addition, the reactive gas stored in the reactive gas storage unit 114 may be supplied to the inlet 120 of the chamber 100 through a reactive gas control valve 134.

In addition, the apparatus of forming a layer by pressure-assisted deposition according to one embodiment of the present invention may further comprise a control unit 150. The control unit 150 may be configured to perform the layer forming method according to one embodiment of the present invention by controlling each element.

More specifically, the control unit 150 may be configured to control the source gas control valve 130, the inert gas control valve 132 and the reactive gas control valve 134 such that source gas, inert gas, reactive gas and inert gas are sequentially supplied to the inlet 120 of the chamber 100.

For step S110 (shown in FIG. 1), the control unit 150 may open the source gas control valve 130 and close the discharge valve 142. Accordingly, when the source gas is supplied to the inside of the chamber 100, the pressure in the chamber may increase to a predetermined pressure. Next, the control unit 150 may also close the source gas control valve 130. Accordingly, the chamber 100 may be closed. This can maintain the inside of the chamber 100 at high pressure, thereby significantly increasing the adsorption rate of the source gas. Namely, the control unit 150 can control the internal pressure of the chamber, thereby improving the step coverage of the layer formed of the source gas adsorbed on the substrate surface. For step S130, the control unit 150 may perform control in the same manner as described above.

For the sub-pressurizing step shown in FIGS. 2 and 3, the control unit 150 may control the source gas control valve 130 and the discharge valve 142. Thus, when the control unit 150 doses the source gas into the chamber, it may provide a pressure for at least two sub-dosing/pressurizing steps and a pressure for a sub-purging step between the at least two sub-dosing/pressurizing steps. In addition, the pressure that has been increased by the sub-dosing/pressurizing step may be maintained through the sub-exposure step.

Furthermore, the control unit 150 may maintain the temperature in the chamber at a constant level when source gas, inert gas or reactive gas is dosed into the chamber. The control unit 150 may control the temperature in the chamber to a temperature of 80° C. to 250° C., for example.

Although it has been described that one embodiment of the present invention is used for deposition of the metal oxide layer, one embodiment of the present invention may also be applied for deposition of a layer other than the metal oxide layer, for example, a dielectric layer, particularly a silicon-containing dielectric layer.

Hereinafter, a method of fabricating a metal oxide transistor according to one embodiment of the present invention and a metal oxide transistor fabricated thereby will be described.

FIG. 11 is a flow chart illustrating a method of fabricating a metal oxide transistor according to one embodiment of the present invention, and FIG. 12 illustrates a metal oxide transistor according to one embodiment of the present invention.

Referring to FIG. 11, a method of fabricating a metal oxide transistor according to one embodiment of the present invention may comprise at least one of the steps of: (S200) preparing a substrate; (S210) forming a gate electrode and a gate insulating layer; (S220) forming an active layer including a metal oxide layer; and (S230) forming source and drain electrodes.

Step S220 may comprise the steps S110, S120, S130 and S140 described above with reference to FIG. 1. Namely, the metal oxide layer may be used as the active layer of the transistor.

Through this method, a metal oxide transistor according to one embodiment of the present invention as shown in FIG. 12 can be fabricated. Referring to FIG. 12, the metal oxide transistor may comprise: a substrate 210; a gate electrode 220 formed on one side of the substrate; a gate insulating layer 230 formed on one side of the gate electrode; a metal oxide-containing active layer 240 formed on one side of the gate insulating layer; and a source electrode 252 and drain electrode 254 formed on one side of the active layer 240.

The active layer 240 comprises a metal oxide layer. When the metal oxide layer comprises zinc oxide, the thickness of the metal oxide layer may be, for example, greater than 1.5 nm. As another example, the thickness of the metal oxide layer may be greater than 1.5 nm and not greater than 7 nm. As still another example, the thickness of the metal oxide layer may be greater than 1.5 nm and not greater than 5 nm. In another aspect, the number of cycles for deposition of the metal oxide layer may be greater than 7. As another example, the number of cycles for deposition of the metal oxide layer may be greater than 7 and not greater than 35. As still another example, the number of cycles for deposition of the metal oxide layer may be greater than 7 and not greater than 25. In another aspect, the surface roughness (RMS) of the metal oxide layer may be less than 4.4 Å.

Although the bottom gate-type metal oxide transistor has been described above with reference to FIG. 12, a metal oxide transistor according to one embodiment of the present invention may also be fabricated as a top gate-type, dual gate-type or coplanar-type transistor. In this case, the sequence of the steps S200 to S230 described above with reference to FIG. 12 may vary depending on the type of transistor.

Hereinafter, the FET characteristics of the metal oxide transistor according to one embodiment of the present invention will be described with reference to FIGS. 13A-13I and 14.

FIGS. 13A-13I show the results of measuring the FET characteristics of metal oxide transistors fabricated according to one embodiment of the present invention. Specifically, FIGS. 13a to 13i show current-voltage (I-V) curves depending on the thickness of the metal oxide layer (i.e., zinc oxide layer). FIG. 14 quantitatively shows the FET characteristic measurement results shown in FIGS. 13A-13I.

For the measurement results shown in FIGS. 13 and 14, metal oxide transistors were fabricated using the metal oxide layer forming process described above with reference to FIG. 4A. In this case, metal oxide layers were deposited to thicknesses of 1.5 nm, 3 nm, 4 nm, 5 nm, 6 nm, 7 nm 8 nm, 9 nm and 10 nm by changing the number of cycles of the unit process.

As a result, it could be seen that when the thickness of the metal oxide layer was 1.5 nm, no FET (field effect transistor) characteristic appeared. Hence, it is preferable that the thickness of the metal oxide layer be greater than 1.5 nm in view of the FET characteristics. In other words, it is preferable that the number of cycles for deposition of the metal oxide layer be greater than 7.

When the thickness of the metal oxide layer was greater than 1.5 nm, it could be seen that stable FET characteristics appeared. Namely, when the thickness of the metal oxide layer was greater than 1.5 nm, it could be seen that on/off ratio characteristics, mobility characteristics, threshold voltages and SS values appeared.

In particular, referring to FIG. 14, it can be seen that the mobility continuously increased until the thickness of the metal oxide layer reached 7 nm, and the mobility decreased at thicknesses of 8 nm, 9 nm and 10 nm. Thus, it is preferable that the thickness of the metal oxide layer be 7 nm or less in view of the mobility. In other words, it is preferable that the number of cycles for deposition of the metal oxide layer be 35 or less. This is because increasing the number of process cycles for deposition of the metal oxide layer may reduce the economy of the process without further improving the mobility characteristics.

In addition, referring to FIG. 14, it can be seen that when the thickness of the metal oxide layer was greater than 1.5 nm, the on/off ratio characteristics were improved. In particular, it can be seen that when the thickness of the metal oxide layer was 7 nm or less, the on/off ratio exceeded $10^6$ which is a common level.

The metal oxide transistor according to one embodiment of the present invention has been described above with reference to FIGS. 13 and 14. Hereinafter, a metal oxide transistor according to a conventional art will be described with reference to FIGS. 15A-15C and 16.

FIGS. 15A-15C show the results of measuring the FET characteristics of metal oxide transistors fabricated according to a conventional art, and FIG. 16 quantitatively show the FET characteristic measurement results shown in FIGS. 15A-15C.

For the measurement results shown in FIGS. 15A-15C and 16, metal oxide transistors were fabricated using the metal oxide layer forming process described above with reference to FIG. 4B. In this case, metal oxide layers were deposited to thicknesses of 4 nm, 5 nm and 10 nm by changing the number of cycles of the process.

As shown in FIGS. 15 and 16, it can be seen that the metal oxide transistors fabricated according to the conventional art showed no FET characteristic even when the thickness of the metal oxide layer was 4 nm.

In addition, it can be seen that when the thickness of the metal oxide layer in the metal oxide transistor fabricated according to one embodiment of the present invention was 5 nm, the mobility reached 30.05 $cm^2$/Vs, but when the thickness of the metal oxide layer in the metal oxide transistor fabricated according to the conventional art was 5 nm, the mobility was only 2.1 $cm^2$/Vs.

Thus, it can be confirmed that the metal oxide transistor according to one embodiment of the present invention exhibits FET characteristics and better transistor characteristics, even when the metal oxide layer therein has a thinner thickness.

As described above, the method of forming a metal oxide layer by pressure-assisted deposition according to one embodiment of the present invention can form a high-quality metal oxide layer. The method of forming a layer according to one embodiment of the present invention can exhibit not only high growth rate, but also excellent surface morphology.

Furthermore, it can be seen that a metal oxide transistor fabricated based on the method of forming a metal oxide layer by pressure-assisted deposition according to one embodiment of the present invention and the method of fabricating the metal oxide transistor exhibit FET characteristics even when the thickness of the metal oxide layer is very thin.

Although the present invention has been described above in detail with reference to exemplary embodiments thereof, the scope of the present invention is not limited to these embodiment and should be construed based on the appended claims. In addition, any person of ordinary skill in the art will appreciate that various modifications and alterations are possible without departing from the scope of the present invention.

The invention claimed is:

1. A metal oxide transistor comprising:
   a gate electrode;
   a gate insulating layer formed on one side of the gate electrode;

an active layer formed on one side of the gate insulating layer and including a metal oxide layer; and source and drain electrodes provided on one side of the active layer, wherein the metal oxide layer has crystalline regions and an amorphous region surrounding the crystalline regions, and the crystalline region surrounded by the amorphous region has an island shape.

2. The metal oxide transistor of claim 1, wherein a thickness of the metal oxide layer is greater than 1.5 nm.

3. The metal oxide transistor of claim 1, wherein the thickness of the metal oxide layer is greater than 1.5 nm and not greater than 7 nm.

4. The metal oxide transistor of claim 1, wherein the thickness of the metal oxide layer is greater than 1.5 nm and smaller than 5.0 nm.

5. The metal oxide transistor of claim 1, wherein the metal oxide layer has a surface roughness (RMS) lower than 4.4 Å.

6. The metal oxide transistor of claim 1, wherein the crystalline regions are randomly distributed in a two-dimensional plane within the amorphous region.

7. The metal oxide transistor of claim 1, wherein the crystalline region has a nanometer size.

8. The metal oxide transistor of claim 1, wherein the metal oxide layer is a zinc oxide layer.

* * * * *